United States Patent [19]
Levinson et al.

[11] Patent Number: 5,540,182
[45] Date of Patent: Jul. 30, 1996

[54] CONVERSION OF POLYCRYSTALLINE MATERIAL TO SINGLE CRYSTAL MATERIAL USING BODIES HAVING A SELECTED SURFACE TOPOGRAPHY

[75] Inventors: Lionel M. Levinson, Schenectady, N.Y.; Curtis E. Scott, Mentor, Ohio

[73] Assignee: General Electric Company, Schenectady, N.Y.

[21] Appl. No.: 126,830

[22] Filed: Sep. 24, 1993

[51] Int. Cl.$^6$ ..................................................... C30B 1/02
[52] U.S. Cl. .................. 117/4; 117/7; 117/920; 117/950
[58] Field of Search .................. 117/4, 7, 10, 920, 117/950, 924; 501/86, 127, 153

[56] References Cited

U.S. PATENT DOCUMENTS

| | | | |
|---|---|---|---|
| 3,026,210 | 3/1962 | Coble | 501/153 |
| 3,943,324 | 3/1976 | Haggerty | 219/121 L |
| 4,150,317 | 4/1979 | Laska et al. | 313/221 |
| 4,285,732 | 8/1981 | Charles et al. | 106/57 |
| 4,444,615 | 4/1984 | Matsuzawa et al. | 117/7 |
| 4,519,870 | 5/1985 | Matsuzawa et al. | 117/7 |

FOREIGN PATENT DOCUMENTS

| | | | |
|---|---|---|---|
| 0053481 | 6/1982 | European Pat. Off. | 117/7 |
| 0211187 | 2/1987 | European Pat. Off. | 117/7 |
| 57-77092 | 5/1982 | Japan | 117/7 |
| 60-21892 | 2/1985 | Japan | 117/7 |
| 60-65797 | 4/1985 | Japan | 117/7 |
| 6228118 | 6/1987 | Japan. | |

OTHER PUBLICATIONS

"Alumina: Sintering and Optical Properties", J. G. J. Peelen, PhD Thesis, Technical University of Eindhoven, Netherlands, May 1977, pp. 1–99.

*Primary Examiner*—Mary Wilczewski
*Attorney, Agent, or Firm*—Stanley C. Corwin; George E. Hawranko

[57] ABSTRACT

A solid step process for converting a polycrystalline body to a single crystal body includes the steps of forming a selected surface topography on the body and then heating the body at a temperature below its melting temperature for a time sufficient to substantially convert the polycrystalline material to single crystal material. The surface topography includes depressions or protrusions from the body having sidewalls of the polycrystalline material that are disposed to intersect one another at junctions forming relatively sharp corners, and the dimensions of the sidewalls are greater than the average grain size of the polycrystalline material. Typically alumina is the polycrystalline material and surface features include grooves or the like. The patterned alumina body with the selected surface topography is heated to a temperature between 1800° and 2000° C. in one or more cycles to convert the polycrystalline alumina to sapphire.

35 Claims, 1 Drawing Sheet

CONVERSION OF POLYCRYSTALLINE MATERIAL TO SINGLE CRYSTAL MATERIAL USING BODIES HAVING A SELECTED SURFACE TOPOGRAPHY

RELATED APPLICATIONS

This application is related to copending applications entitled "Solid State Formation of Sapphire Using a Localized Energy Source", Serial No, 08/064,386, filed May 21, 1993; "Solid State Formation of Sapphire From Polycrystalline Alumina Using a Seed Crystal", Ser. No. 08/126,628, filed pending concurrently herewith still pending; "Solid State Thermal Conversion of Polycrystalline Alumina to Sapphire", Ser. No. 08/126,954, filed concurrently herewith, now U.S. Pat. No. 5,451,553, all of which are assigned to the assignee of the present invention and which are incorporated herein by reference.

BACKGROUND OF THE INVENTION

This invention relates to a solid state process for converting ceramic material having a polycrystalline structure to a single crystal structure by forming a selected surface topography on a body made of polycrystalline material and heating the polycrystalline material body.

The manufacture of polycrystalline alumina (PCA), and its use for high pressure sodium arc discharge lamps (hereinafter "HPS lamps") is known in the art. U.S. Pat. Nos. 3,026,210; 4,150,317 and 4,285,732 to Coble, Laska et al and Charles et al, disclose the production of a high density PCA body having improved visible light transmission using relatively pure alumina powder and small amounts of magnesia. U.S. Pat. No. 4,285,732 further teaches adding zirconia and hafnia to the magnesia-doped alumina to reduce the chances of precipitating a spinel phase and exaggerated or run away grain growth during sintering. PCA bodies useful as arc tubes for HPS lamps have been made according to the processes in these patents having an average grain size ranging from between 15 microns to 100 microns.

Two major drawbacks associated with the use of PCA arc tubes for HPS lamps are that they are light translucent as opposed to light transparent and the sodium in the arc reacts with the alumina at the grain boundaries to form sodium aluminate, which adversely affects the structural integrity of the tube and shortens lamp life. HPS lamps are being designed for ever increasing internal sodium partial pressure within the PCA arc tube to improve the color rendition and provide a whiter emitted light. However, higher internal sodium pressure further shortens lamp life due to increased rate of sodium loss from the arc chamber. Progressive sodium loss results in a corresponding continual rise in the lamp operating voltage, a decrease of both correlated color temperature and color rendering index, and a color shift from white to pink. Also, the sodium which migrates through the arc chamber wall deposits on the inside wall of the evacuated outer lamp envelope causing a brownish stain on the envelope which, in turn, further reduces the light output of the lamp. These problems are substantially reduced with sapphire (i.e., single crystal alumina) arc tubes.

Sapphire arc tubes useful as the arc chamber for HPS lamps have been made by a number of processes, including a modified Czochralski process known as the edge-defined, film-fed growth (EFG) process developed by Tyco Laboratories, Inc. This process uses a seed crystal and a die on the surface of molten alumina in which a hollow tube is continuously pulled out of the melt through the die. This process is expensive and slow. Another process used to produce single crystal alumina (sapphire) is called the floating zone process in which a PCA feed rod is introduced at a predetermined velocity into a heating zone wherein one or more lasers or other concentrated heat source is focused on the rod to melt the alumina in the zone to produce a "melt volume" of molten alumina. A sapphire fiber is continuously drawn from the melt volume at the desired velocity and the feed rod is moved simultaneously, but at a slower rate so that the process is a continuous one. This process is used primarily to produce sapphire fibers and does not readily lend itself to production of single crystal alumina tubing, although its use for such is disclosed in U.S. Pat. No. 3,943,324.

Japanese Patent Publication 62-28118 of H. Yoshida et al. discloses that sapphire can be synthesized via solid state process by inducing a magnesia concentration gradient along the length of a PCA body to ensure grain growth is initiated at a single point on the PCA body during heat treatment. This magnesia gradient can be produced in the PCA body by doping the green body with magnesia in such a way that there is a magnesia gradient in the PCA body, by using a temperature gradient to create the magnesia concentration gradient, or by thinning a section on the green body. Key to the Yoshida process is that the growth of the single crystal initiate from a single location in the polycrystalline body. Further, it is not known if this process was commercialized and the disclosure on its face appears to present potential difficulties in its implementation. In particular, the Yoshida process would necessarily require that sufficient magnesia be added to the alumina to prevent anomalous grain growth during the initial stages of heat treatment of the alumina body. The example used for illustration in the Yoshida patent application, however, suggests the alumina material be doped with approximately 90 ppm of magnesia. It has been shown that at least 300 ppm of magnesia is required to prevent anomalous grain growth in alumina at temperatures of 1850° C. See, e.g., J. G. J. Peelen "Alumina: Sintering and Optical Properties", Ph.D Thesis, Technical University of Eindhovan, Netherlands, May 1977. It is thus likely that heat treatment of alumina doped with a lesser concentration of magnesia would result in the formation of an alumina body composed of multiple coarse crystals rather than a single crystal.

A need exists for producing sapphire from PCA in a facile and relatively inexpensive manner. Solid state conversion of a polycrystalline ceramic article or body to a single crystal, that is, without melting the structure that is being converted, is desirable so that the single crystal has substantially the same size and shape as the polycrystalline article. A solid state conversion process would make it possible to manufacture single crystal articles having nonuniform, asymmetric and complex shapes as well as simple shapes. It would also be a great improvement to the art if such a process were cost effective in greatly reducing both the energy and the time required to effect the formation of a single crystal ceramic structure from a polycrystalline ceramic structure.

SUMMARY OF THE INVENTION

In accordance with the present invention, a solid state process for converting a solid polycrystalline ceramic body to a single crystal body of the same chemical composition includes the steps of forming a selected surface topography on the ceramic body and heating the polycrystalline body at a temperature below the melting temperature of the polycrystalline material for a time sufficient to substantially convert the polycrystalline body to a single crystal body. The selected surface topography includes surface features having sidewalls in the polycrystalline material that are disposed to intersect at an angle at respective junctions so as to form a relatively sharp corner. Respective length and width dimensions of each sidewall are greater than the average grain length in the polycrystalline material, and at each junction the radius of curvature between the intersection of the two adjoining sidewalls is less than the average grain length.

The method of this invention is particularly adapted for the solid state conversion of polycrystalline alumina (PCA) to sapphire. The selected surface topography features include indentations, such as grooves, and protrusions, such as ridges, and have a selected orientation with respect to the PCA body, such as being aligned along the longitudinal axis of the PCA body or disposed around the circumference (or periphery) of the PCA body. In particular, in a cylindrically shaped PCA body, circumferential grooves having a depth greater than the average grain size are typically cut at selected intervals along the length of the PCA body. The heating of the PCA body typically includes multiple treatment cycles in a continuous high temperature furnace and may include the step of sintering the PCA body prior to treating it in one or more cycles in the continuous furnace.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1A:
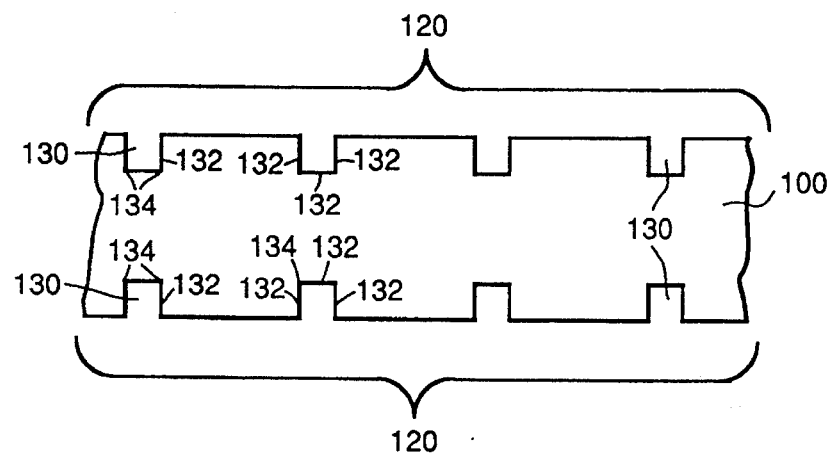
FIG. 1(A) is plan view of a tubular polycrystalline body having a selected surface topography in accordance with one embodiment of this invention.
Figure 1B:
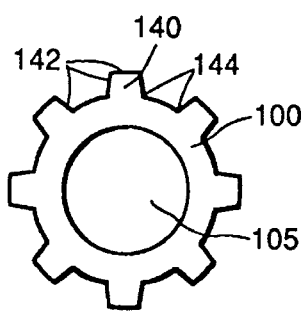
FIG. 1(B) is a cross-sectional view of a tubular polycrystalline body having a selected surface topography in accordance with another embodiment of this invention.
Figure 2:
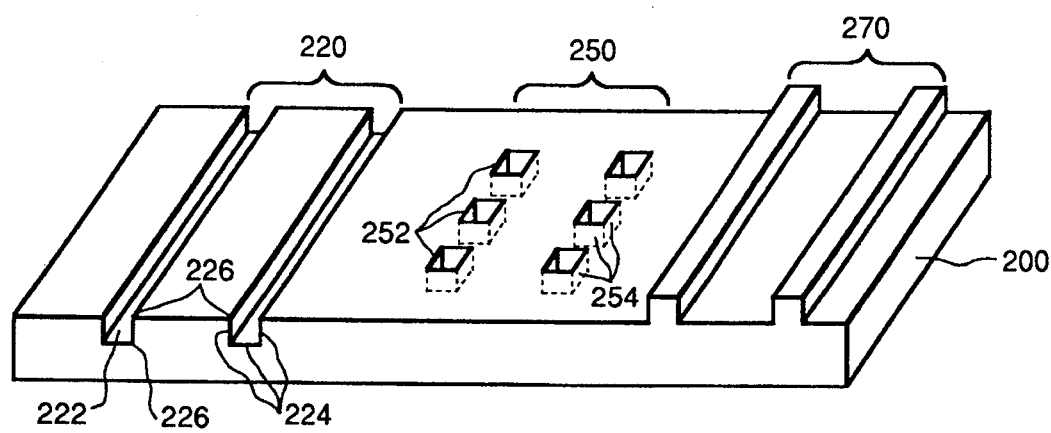
FIG. 2 is a perspective view of a sheet of a polycrystalline material having a selected surface topography in accordance with this invention.

In accordance with the present invention, a polycrystalline body is processed to have a selected surface topography and is then heated at a temperature less than the melting temperature of the polycrystalline material for a time sufficient to substantially convert polycrystalline body to a single crystal body. A tubular-shaped polycrystalline body 100 is illustrated in FIGS. 1(A) and 1(B) having a selected surface topography 120, 140, respectively, described more fully below, and a flat shaped polycrystalline body 200 having representative first, second, and third selected surface topographies 220, 250, and 270, is illustrated in FIG. 2. The tubular and flat shapes of polycrystalline bodies, and the attendant surface topographies shown in the figures, are for illustrative purposes only and are not meant to any way limit the range of shapes or forms of polycrystalline bodies that can be used in accordance with this invention.

A starting material which as been found useful in the practice of the embodiment of the invention wherein polycrystalline bodies 100, 200 comprise polycrystalline alumina (PCA) and the PCA body is converted to sapphire, is a PCA body of relatively pure alpha alumina free of microcracks. The presence of microcracks will prevent the sapphire crystal front from propagating and thereby prevent conversion of the PCA to sapphire. In general this means that the PCA body will have an average crystallite or grain size below 100 microns, preferably no greater than 70 microns and still more preferably no greater than 50 microns. The pore volume fraction is preferably no greater than $1 \times 10^{-2}$. The density will be greater than 3.90 g/cc, and more typically greater than 3.97 g/cc. The density of the Lucalox® brand PCA used in the examples reported herein is at least 3.97 g/cc and more typically about 3.98 g/cc. The PCA body will preferably have a relatively uniform grain size with an average grain size ranging between about 15–70 microns and more preferably between about 20–50 microns. By grain size is meant the average dimension of a grain as measured by the well-known linear intercept technique described in ASTM E112-88. The PCA should be greater than 99 wt. % alpha alumina and free of impurities of a type and in an amount that would prevent conversion of the PCA body to sapphire. One example is magnesia in an amount of as little as 100 wppm (that is, ppm by weight), preferably below 70 wppm and still more preferably below 50 wppm. By "below 50 wppm" is meant to include PCA with no magnesia or PCA with a magnesia content from 0–50 wppm. The PCA starting material can be prepared from alumina powder and suitable dopants using the processes known and described in the U.S. Pat. Nos. 3,026,210; 4,150,317 and 4,285,732 referred to earlier or it can be any commercially available PCA material meeting the requirements of purity, density, gain size, etc., referred to above, such as the General Electric Company brand of Lucalox® PCA available from the General Electric Company in Cleveland, Ohio.

The General Electric Company Lucalox® brand of PCA has an equiaxed grain structure and a relatively uniform grain size with the average crystallite or grain size generally ranging between 20–35 microns. For an average grain size of approximately 26 microns diameter the majority (i.e., >50%) of the grains range from about 20 microns diameter to about 30 microns diameter, with no grains being larger than 100 microns and with few, if any (i.e., <1%) being over 70 microns. Magnesium oxide or magnesia (MgO) is present in an amount of abut 300–400 wppm and the Lucalox® brand PCA has a melting point of about 2050° C. A typical chemical analysis for Lucalox® PCA which is 99.9% alumina is set forth in Table 1 below:

TABLE 1

| Trace Element | Si | Fe | Ca | Mg | K | Na | Li | Mo | Cr | Cu |
|---|---|---|---|---|---|---|---|---|---|---|
| PPM Detected | 50 | 4 | 7 | 180 | 50 | 80 | <1 | 10 | 2 | 4 |

The 180 wppm of magnesium is equivalent to 325 wppm of magnesia which is a typical level of magnesia present in this material. The (sintered) density of Lucalox® PCA is typically at least 3.97 g/cm³ and generally approximately 3.98 g/cm³ and it has a translucent white appearance. Since the amount of magnesium oxide present in Lucalox® PCA is too great to permit its conversion to sapphire in the process of this invention, the amount of magnesium oxide present in it must be reduced to a level below 100 wppm, preferably below 70 wppm and still more preferably below 50 wppm in order to be able to convert the Lucalox® PCA to sapphire in the process of this invention.

Those skilled in the art know that the magnesium oxide can be driven out by heating the PCA body in a hydrogen-containing atmosphere, vacuum, or inert gas at a temperature between about 1700°–2000° C. Heating the PCA body to these temperature regimes to reduce the magnesium oxide content, followed by cooling down to room temperature, is done slowly to avoid thermal shock and concomitant cracking of the PCA body. This has been accomplished in a facile manner in a high temperature electric resistance furnace by slowly heating the PCA body up to a temperature of about 1880° C. in dry hydrogen, holding at 1880° C. and then slowly cooling down to room temperature. Hydrogen having a dew point below 0° C. is preferred. The drier the hydrogen the less time is required to remove the magnesia. Other times, temperatures and atmospheres can be used to reduce the magnesia content as is known to those skilled in the art. Thicker samples will, of course, require more time. With General Electric Company Lucalox® brand of hollow PCA tubing having a 5 mm OD and a 1/2 mm wall thickness, about 9–12 hours at 1880° C. were required to reduce the magnesia content to a level below 50 wppm. The magnesia level was determined in all cases by using the Inductively Coupled Plasma (ICP) analysis. The lowest limit of magnesia measurable by this method is 10 wppm.

Any available PCA material having the characteristics set forth above may be employed in practicing the process of the invention, including PCA fabricated without having magnesia present. Alternately, the practitioner may if desired, fabricate his own PCA material starting with a suitable grade of relatively pure particulate alumina being primarily alpha alumina, such as Baikowski CR-10, using the techniques known by those skilled in the art that will produce a dense alumina body or article having the material characteristics described above.

In accordance with this invention, tubular shaped polycrystalline body 100 comprising PCA prepared as described above is processed to form a selected surface topography 120 on the ceramic body. "Topography" as used herein refers to the surface features or surface configuration of the polycrystalline body, including, but not limited to, protrusions from the surface and depressions into the surface, and the orientation of such surface features on the PCA body. As illustrated in FIG. 1(A), surface topography 120 comprises grooves 130 having sidewalls 132 formed in the PCA. Sidewalls 132 are disposed to intersect at respective junctions 134 so as to form an angle between adjoining sidewalls. The angle between sidewalls 132 at respective junctions 134 is such so as to form relatively sharp corners, that is there is little or no curvature at the junction. "Little or no curvature" refers to the radius of any curvature is less than about the average grain size in polycrystalline body 100. The angle formed at the exterior junction of two sidewalls (i.e., the angle between the surfaces of the sidewalls forming the surface of the polycrystalline body) can be acute, right, or obtuse, and is typically in the range of 20° to 160°; for reasons of ease of fabrication, right angles commonly used. Further, each dimension of sidewall 132, that is the length and the width of the sidewall, is equal to or greater than the average grain size in polycrystalline body, and typically are at least five times larger or more than the average grain size. Sizing the dimensions of surface features 130 to be greater than the average grain size of the polycrystalline material and disposing the sidewall such that junctions 134 form sharp corners promotes the conversion of the polycrystalline material to a single crystal structure.

The selected surface topography illustrated in FIG. 1(A) comprises a plurality of grooves 130 that are disposed around the circumference of the tube, that is, the grooves run around tubular body 100 and are aligned substantially perpendicularly to the longitudinal axis of tubular body 100. Alternatively, the selected surface topography of polycrystalline body 100 may comprise protrusions 140 formed on the surface of polycrystalline body 100, one example of which is illustrated in FIG. 1(B). Such protrusions are disposed along the surface aligned substantially with the longitudinal axis of the tube, or, alternatively, can be disposed around the circumference similar to the grooves discussed above. Protrusions 140 comprise sidewalls 142 in the PCA material that intersect at junction 144 so as to form relatively sharp corners, as described above with respect to FIG. 1(A). Similarly, the dimensions of sidewalls 142 am greater than the average grain size of the PCA material comprising body 100 and typically am five times larger or more than the average grain size. By way of example and not limitation, tubular body 100 is illustrated in FIG. 1(B) having an interior hollow area 105, as is common in alumina tubes processed for use in lighting applications. Surface features cut into tubular PCA used in light applications typically would have a thickness no greater than about 50% of the wall thickness of the PCA body. PCA tubing used for lighting purpose typically has a wall thickness between 0.2 mm and 2 mm, and hence the maximum depth of the grooves is between 0.1 mm and 1 mm, respectively.

Alternatively, as illustrated in FIG. 2, polycrystalline body 200 can have a non-tubular shape, such as a sheet or block of polycrystalline material, or other desired shape as can be formed from ceramic material. For purposes of illustration only, polycrystalline body 200 is illustrated having respective first, second, and third sets of surface features, 220, 250, and 270. First set of surface features 220 comprises grooves 222 having sidewalls 224 disposed to form junctions 226 as described above with respect to FIGS. 1(A) and 1(B). The angle at which sidewalls 224 intersect and the dimensions of sidewalls 224 are as described above with respect to FIGS. 1(A) and 1(B). Second set of surface features comprises depressions 252, each of which has sidewalls 254 disposed such that junctions formed at the intersection of sidewalls form a relatively sharp corner as noted above. Third set of surface features 270 comprises protrusions from the surface of body 200, such protrusions similarly having sidewalls intersecting at junctions to form relatively sharp corners. The shortest dimension (length or width, etc.) of the sidewall in each surface feature noted in surface topographies 220, 250, and 270 has a length greater than the average grain size of the polycrystalline material in body 200, and typically about about five times larger or more than the average grain size. Surface features other than the types illustrated in FIG. 2 (e.g., columnar protrusions) can similarly comprise a selected surface topography in accordance with this invention.

The surface features of a particular surface topography are typically disposed on the polycrystalline body at selected positions. Separate surface features are typically separated by a distance greater than about ten times the average grain size, and by no less than shortest dimension of the polycrystalline body in which the surface features are formed.

The selected surface topography is formed on the green body precursor of the polycrystalline body by casting, pressing, or extruding the polycrystalline material to have the desired surface features, or, alternatively, by patterning the polycrystalline body after it has been cast or extruded. Forming the selected topography can be performed before or after sintering the polycrystalline body. Patterning the polycrystalline body after it has been cast, pressed, or extruded is typically done by applying a cutting implement to cut (or scribe) the desired surface features into the polycrystalline body. For example a mechanical device, such as a saw or related machining tool, can be used, or alternatively, a non-mechanical cutting device, such as a laser, can be used to pattern the polycrystalline body.

In accordance with this invention, the polycrystalline body having the selected surface topography formed thereon is then heated to a temperature not greater than the melting point of the polycrystalline material. For ceramic bodies comprising alumina as described herein, the PCA body is heated to a temperature greater than 1100° C. but less than 2050° C., the melting point of alumina. No bulk melting of the ceramic is observed during the process of converting the alumina to sapphire, and growth of the single crystal structure is typically initiated from more than one situs on the body. Specifically, growth of the single crystal structure typically initiates from one or more of the junctions in the surface features. Details of the solid state thermal conversion process are contained in copending application Ser. No. 08/126,954, incorporated herein by reference.

In one example of the process of this invention, PCA tubing comprising Lucalox® treated as described above to lower the magnesia content and being about 220 mm long, with about a 5 mm outer diameter and a 0.5 mm wall thickness, was processed to have a surface topography comprising grooves extending around the circumference of the tube, with the grooves being disposed about 10 mm apart along the length of the tube. The grooves were cut with a diamond wire cutter to a depth of between about 0.1 mm and 0.2 mm and a width between about 0.4 mm and 0.5 mm.

After the tubes were patterned to have the desired surface topography, a set of grooved presintered tubes and a presintered ungrooved control tube were sintered in an alumina muffle tube molybdenum resistance furnace (muffle tube furnace) at about 1800° C. in hydrogen at a low dewpoint (about −60° C.) for about 3 hours. The samples were then heat treated in a tunnel high temperature hydrogen sintering furnace (tunnel furnace), in which the samples are placed inside molybdenum housings that are continuously moved through the furnace, for 2 cycles; each cycle comprised about a 15 hour heat up to a temperature of about 1880° C., about 3 hours at the 1880° C. temperature, and then hour cooldown cycle back to ambient room temperature. A relatively low dewpoint (about −10° C.) hydrogen atmosphere is also maintained in the tunnel furnace during the time the tubes were processed in that furnace. Results of this test are as follows:

TABLE 2

| Sample | Muffle Tube Furnace Treatment Only | Tunnel Furnace (2 cycles following Muffle Tube Furnace Treatment) |
|---|---|---|
| Grooved Tube #1 | Sapphire 2–5 mm length adjacent to grooves | Multiple sapphire crystals 20–40 mm along length of tube (≈80% of total length of tube converted to sapphire) |
| Grooved Tube #2 | Sapphire 2–5 mm adjacent to grooves | 150 mm saphhire along length (≈70% of total length of tube converted to sapphire) |
| Control Tube (no grooves) | No indication of sapphire | 40 mm sapphire (≈20% of total length of tube converted to sapphire) |

Examination of tubes treated in this fashion revealed that tubes having the selected surface topography (i.e., the grooved tubes) showed about 2–5 mm of sapphire formation adjacent to the grooves after sintering in the muffle tube furnace, whereas the control (ungrooved) tube showed no sapphire. After two cycles through the the tunnel furnace, the grooved samples converted to a higher percentage of sapphire over the control, as shown in Table 2. In one instance, multiple large sapphire crystals were formed and in another sample a single 150 mm long sapphire crystal was formed.

In a second example of the process of this invention, PCA tubing as described above was prepared having the selected surface topography of grooves. Control (ungrooved) tubes and a grooved tube were then exposed to multiple cycles, as detailed in Table 3 below, in the tunnel furnace (having the same cycle arrangement as described above).

TABLE 3

| | CYCLES THROUGH TUNNEL FURNACE | | | |
|---|---|---|---|---|
| Sample | 1× | 2× | 3× | 4× |
| Grooved Tube | No sapphire | 2–5 mm sapphire adjacent to grooves | 2–5 mm sapphire adjacent to grooves | 100% of length of total converted to sapphire |
| Control Tube | No sapphire | 2–5 mm sapphire on ends | 2–5 mm sapphire on ends | 50% of total length converted |

After two cycles through the tunnel furnace, the grooved tubes showed sapphire forming adjacent to the grooves along the length of the tube. After four cycles in the tunnel furnace, the grooved tube had completely converted to sapphire whereas the control tubes still had significant areas of polycrystalline material.

It is understood that various other modifications will be apparent to and can be readily made by those skilled in the art without departing from the scope and spirit of the invention. Accordingly, it is not intended that the scope of the claims appended hereto be limited to the description set forth above but rather that the claims be construed as encompassing all of the features of patentable novelty which reside in the present invention, including all features which would be treated as equivalents thereof by those skilled in the art to which the invention pertains.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A solid state process for converting a solid polycrystalline ceramic body to a single crystal body of the same chemical composition comprising the steps of:

forming a selected surface topography on said ceramic body comprising surface features selected from the group comprising protrusions from said polycrystalline body and depressions into said polycrystalline body, said topography comprising surface features having sidewalls of said polycrystalline ceramic wherein the respective length and width dimensions of each of said sidewalls is greater than the average grain size in said polycrystalline body, and that are disposed to intersect at respective junctions so as to form an angle between adjoining sidewalls; and heating said polycrystalline ceramic body at a temperature below the melting temperature of the polycrystalline material for a time sufficient to substantially convert said polycrystalline body to said single crystal body.

2. The method of claim 1 wherein the step of forming said selected surface topography further comprises the step of disposing said sidewalls at said junctions such that the radius of curvature at each of said junctions between adjoining sidewalls is less than about the average size in said polycrystalline body.

3. The method of claim 2 wherein said sidewalls are disposed at each end of said junctions so as to form substantially sharp corners between respective adjoining sidewalls.

4. The method of claim 2 wherein said surface features are disposed substantially around the circumference of said polycrystalline body.

5. The method of claim 2 wherein said surface features are aligned substantially along the longitudinal axis of said polycrystalline body.

6. The method of claim 2 wherein the step of disposing surface features on said polycrystalline body comprises the step of patterning the green body precursor of said polycrystalline body.

7. The method of claim 6 wherein the step of patterning said green body precursor comprises the step of extruding said polycrystalline material in the desired form.

8. The method of claim 6 wherein the step of patterning the green body precursor comprises the step of casting said polycrystalline material in the desired form.

9. The method of claim 6 wherein the step of patterning the green body precursor comprises the step of pressing said polycrystalline material into the desired form.

10. The method of claim 2 wherein the step of disposing surface features on said polycrystalline body comprises the step of applying a cutting instrument to said body.

11. The method of claim 10 wherein said cutting instrument is selected from the group comprising lasers and mechanical devices.

12. The method of claim 2 wherein said surface features comprise grooves in the surface of said polycrystalline body.

13. The method of claim 12 wherein said grooves are disposed substantially around the circumference of said polycrystalline body.

14. The method of claim 2 wherein said surface features are disposed at a selected distance between one another.

15. The method of claim 14 wherein said selected distance between surface features is greater than the average grain size in said polycrystalline body.

16. The method of claim 15 wherein said selected distance between surface features is at least five times greater than said average grain size in said polycrystalline body.

17. A solid state process for converting a solid polycrystalline alumina (PCA) body to sapphire which comprises the steps of:

forming a selected surface topography on said PCA, said topography comprising surface features having a selected pattern and having sidewalls in said PCA body disposed to intersect at respective junctions so as to form a corner between adjoining sidewalls, each of said sidewalls having respective length and width dimensions that are greater than the average grain length of said PCA; and heating said polycrystalline ceramic body at a temperature above 1500° C., but below the melting point of said PCA body, for a time sufficient to substantially convert said PCA body to a body comprising substantially only sapphire.

18. The process of claim 17 wherein said the step of forming said selected topography comprises the step of disposing said sidewalls such that at respective junctions the intersection of said sidewalls comprises a sharp corner.

19. The process of claim 18 wherein said surface features comprise formations selected from the group comprising grooves, ridges, indentations, and protrusions.

20. The process of claim 19 wherein the step of forming said surface topography comprises the step of patterning the green body precursor of said PCA body.

21. The process of claim 19 wherein the step of forming said surface topography comprises the step of patterning the pre-sintered PCA body.

22. The process of claim 21 wherein the step of patterning said pre-sintered PCA body comprises the step of cutting portions of said PCA body to form said surface features.

23. The process of claim 22 wherein the step of cutting portions of said PCA body further comprises the step of scribing said PCA body with a cutting implement to form grooves in said PCA body at selected locations.

24. The process of 23 wherein said PCA body has a substantially cylindrical outer surface.

25. The process of claim 24 wherein the grooves cut into said PCA body are disposed substantially around the circumference and normal to the longitudinal axis of said PCA body.

26. The process of claim 25 wherein said PCA body comprises a hollow tube having a predetermined wall thickness.

27. The process of claim 26 wherein the groove cut in said PCA has a depth no greater than 50% of said predetermined wall thickness.

28. The process of claim 27 wherein the wall thickness of said PCA body is between 0.2 mm and 2 mm, and the depth of said groove is between 0.2 mm and 1 mm.

29. The process of claim 28 wherein the step of cutting a groove further comprises the step of applying a diamond wire cutter to said PCA body so as to scribe a substantially circumferential groove around said body.

30. The process of claim 19 wherein the step of heating said PCA body further comprises the steps of sintering said PCA body for a first selected time at a first selected temperature and then treating said PCA body in a high temperature furnace for at least one cycle having a selected cycle high temperature and a selected cycle high temperature exposure time.

31. The process of claim 30 wherein said first selected temperature is about 1800° C., said first selected time is about 3 hours, said selected cycle high temperature is about 1880° C., and said selected cycle high temperature exposure time is about 3 hours.

32. The process of claim 31 further comprising the step of treating said PCA body multiple times in said high temperature furnace.

33. The process of claim 32 wherein said PCA body undergoes two treatment cycles in said high temperature furnace.

34. The process of claim 19 wherein the step of heating said PCA body further comprises the steps of treating said PCA body in a high temperature furnace for multiple cycles, each of said cycles having a selected cycle high temperature and a selected cycle high temperature exposure time.

35. The process of claim 34 wherein said selected cycle high temperature is about 1880° C., and said selected cycle high temperature exposure time is about 3 hours.

* * * * *